US 9,673,311 B1

United States Patent
Moens et al.

(10) Patent No.: US 9,673,311 B1
(45) Date of Patent: Jun. 6, 2017

(54) ELECTRONIC DEVICE INCLUDING A MULTIPLE CHANNEL HEMT

(71) Applicant: SEMICONDUCTOR COMPONENTS INDUSTRIES, LLC, Phoenix, AZ (US)

(72) Inventors: Peter Moens, Erwetegem (BE); Jia Guo, Durham, NC (US); Ali Salih, Mesa, AZ (US); Chun-Li Liu, Scottsdale, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/182,405

(22) Filed: Jun. 14, 2016

(51) Int. Cl.
*H01L 29/66* (2006.01)
*H01L 29/06* (2006.01)
*H01L 29/20* (2006.01)
*H01L 29/778* (2006.01)
*H01L 29/205* (2006.01)
*H01L 21/02* (2006.01)

(52) U.S. Cl.
CPC ...... *H01L 29/7787* (2013.01); *H01L 21/0254* (2013.01); *H01L 29/0657* (2013.01); *H01L 29/0692* (2013.01); *H01L 29/205* (2013.01); *H01L 29/66462* (2013.01)

(58) Field of Classification Search
CPC ............ H01L 29/7787; H01L 29/0657; H01L 29/0692; H01L 29/205; H01L 29/66462
See application file for complete search history.

(56) References Cited

U.S. PATENT DOCUMENTS

| 6,028,328 | A | 2/2000 | Riechert et al. |
| 7,642,567 | B2 * | 1/2010 | Amasuga ............ H01L 29/0649 257/194 |
| 7,663,161 | B2 * | 2/2010 | Kaibara ............. H01L 29/1066 257/183 |
| 7,906,417 | B2 * | 3/2011 | Makiyama ........ H01L 29/66431 257/E21.068 |
| 8,164,115 | B2 * | 4/2012 | Hikita ................ H01L 29/1066 257/192 |
| 2006/0065908 | A1 | 3/2006 | Beach |

(Continued)

OTHER PUBLICATIONS

Arch, D.K. et al., "Superlattice Conduction in Superlattice Modulation-Doped Field-Effect Transistors," Journal of Applied Physics vol. 61, No. 4, dated Feb. 15, 1987, pp. 1503-1509.

(Continued)

*Primary Examiner* — Ida M Soward
(74) *Attorney, Agent, or Firm* — Abel Law Group, LLP

(57) ABSTRACT

An electronic device can include a HEMT including at least two channel layers. In an embodiment, a lower semiconductor layer overlies a lower channel layer, wherein the lower semiconductor layer has an aluminum content that is at least 10% of a total metal content of the lower semiconductor layer. An upper semiconductor layer overlies the upper channel layer, wherein the upper semiconductor layer has an aluminum content that is greater as compared to the lower semiconductor layer. In another embodiment, an electronic device can include stepped source and drain electrodes, so that lower contact resistance can be achieved. In a further embodiment, an absolute value of a difference between pinch-off or threshold voltages between different channel layers is greater than 1 V and allows current to be turned on or turned off for a channel layer without affecting another channel layer.

13 Claims, 3 Drawing Sheets

(56) References Cited

U.S. PATENT DOCUMENTS

| | | | |
|---|---|---|---|
| 2007/0077745 A1 | 4/2007 | He et al. | |
| 2009/0065810 A1 | 3/2009 | Honea et al. | |
| 2013/0240911 A1 | 9/2013 | Beach | |
| 2014/0264369 A1* | 9/2014 | Padmanabhan | H01L 29/7787 257/76 |
| 2014/0266324 A1 | 9/2014 | Teo et al. | |
| 2015/0263104 A1* | 9/2015 | Saito | H01L 29/1066 257/76 |
| 2015/0303292 A1* | 10/2015 | Shibata | H01L 29/42316 257/76 |
| 2016/0043181 A1 | 2/2016 | Liu et al. | |

OTHER PUBLICATIONS

Baba, Toshio et al., "High Performance (AlAx/n-GaAs Superlattice)/GaAs 2DEGFETs with Stabilized Threshold Voltage," Japanese Journal of Applied Physics, vol. 23, No. 8, dated Aug. 1984, pp. L654-L656.

Chu, Rongming et al., "AlGaN—GaN Double-Channel HEMTs," IEEE Transactions on Electron Devices, vol. 52, No. 4, dated Apr. 2005, pp. 438-446.

Guo, Jia et al., "Ultra-Scaled AlN/GaN Enhancement-&, Depletion-Mode Nanoribbon HEMTs," ISDRS, dated Dec. 9-11, 2009, 2 pages.

Howell, Robert S. et al, "The Super-Lattice Castellated Field Effect Transistor (SLCFET): A Novel High Performance Transistor Topology Ideal for RF Switching," IEDM Technical Digest, dated 2014, pp. 291-294.

Palacios, Tomás et al., "Use of Double-Channel Heterostructures to Improve the Access Resistance and Linearity in GaN-Based HEMTs," IEEE Transactions on Electron Deviced, vol. 53, No. 3, dated Mar. 2006, pp. 562-565.

Si, Quan et al., "AlGaN/GaN Double-Channel HEMT," Journal of Semiconductors, vol. 31, No. 4, dated Apr. 2010, pp. 044003-1-044003-3.

* cited by examiner

ELECTRONIC DEVICE INCLUDING A MULTIPLE CHANNEL HEMT

FIELD OF THE DISCLOSURE

The present disclosure relates to electronic devices, and more particularly to, electronic devices that include high-electron mobility transistors having at least two channel layers.

RELATED ART

High electron mobility transistors (HEMTs) can have a two dimensional electron gas (2DEG) with a relatively low resistivity, and such resistivity can be affected by the amount of aluminum within and AlGaN barrier layer. As the Al content increases, the resistivity becomes lower. However, when the Al content is too high, more strain can result, thus increasing the risk of wafer breakage and inverse piezo-electric effect. Alternatively, an AlN spacer has been proposed, but obtaining a good ohmic contact can be difficult to obtain.

BRIEF DESCRIPTION OF THE DRAWINGS

Embodiments are illustrated by way of example and are not limited in the accompanying figures.

Figure 1:
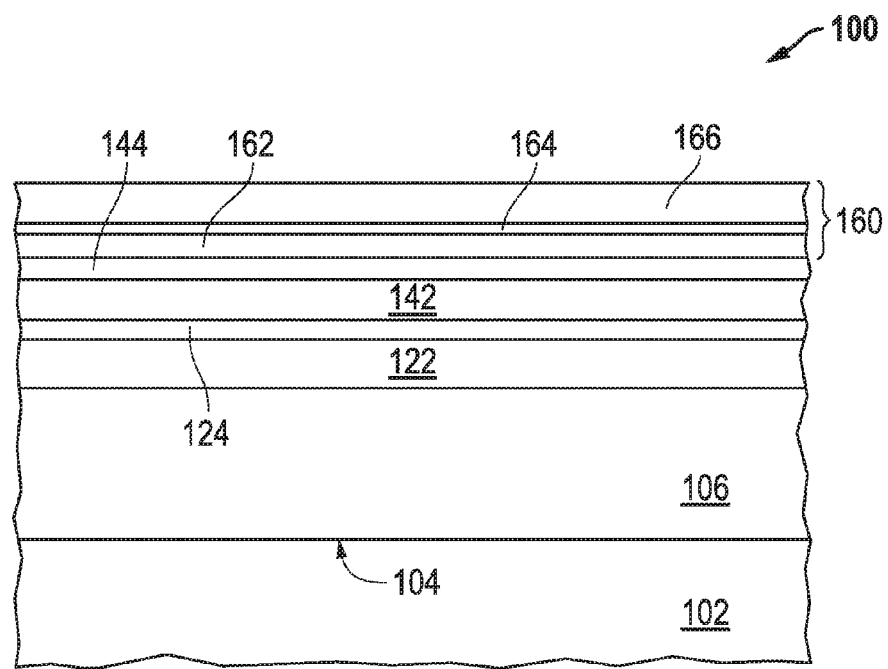
FIG. 1 includes an illustration of a cross-sectional view of a portion of a workpiece including a substrate and a set of layers overlying the substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_\nu Ga_{(1-\nu)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a HEMT include a first channel layer and a second channel layer overlying the first channel layer. In an embodiment, a first semiconductor layer overlies the first channel layer, wherein the first semiconductor layer has a first aluminum content that is at least 10% of a total metal content of the first semiconductor layer. A second semiconductor layer overlies the second channel layer, wherein the second semiconductor layer has a second aluminum content that is greater than the first aluminum content. In another embodiment, an electronic device can include stepped source and drain electrodes, so that lower contact resistance can be achieved. In a further embodiment, the first channel layer has a first pinch-off voltage, and the second channel layer has a second pinch-off voltage. An absolute value of a difference between the first and second pinch-off voltages is greater than 1 V. The difference in pinch-off voltage can allow a HEMT to have current for at least one channel layer can be turned off or turned on without significantly affecting current flow for an adjacent channel layer.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

A first set of embodiments are directed to an electronic device that includes a HEMT having two channel layers. Embodiments with more than two channel layers can be used and will be addressed later in this specification. After reading the specification, skilled artisans will be able to use the concepts described with respect to two channel layers and apply such concepts to HEMTs having more than two channel layers.

FIG. 1 includes an illustration of a cross-sectional view of a portion of a workpiece 100 that includes a substrate 102, a buffer layer 106, a lower channel layer 122, a lower semiconductor layer 124, an upper channel layer 142, and upper semiconductor layer 144, and a passivation layer 160 that includes a gate dielectric film 162, an intermediate film 164, and a capping film 166. The substrate 102 has a primary surface 104 and can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 104 can be selected depending upon the composition of the layers that will be subsequently formed over the substrate 102.

The buffer layer 106 can help to epitaxially grow the overlying layers 122, 124, 142, and 144. The composition of the buffer layer 106 may depend on the composition of the lower channel layer 122. In an embodiment, the lower channel layer 122 includes GaN, and the buffer layer 106 includes AlGaN. The composition of the buffer layer 106 can be changed as a function of thickness, such that the buffer layer 106 has a relatively greater aluminum content closer to the substrate 102 and a relatively greater gallium content closer to the lower channel layer 122. In a particular embodiment, the cation (metal atoms) content in the buffer layer 106 near the substrate 102 can be 10% to 100% Al with the remainder Ga, and the cation content in the buffer layer 106 near the lower channel layer 122 can be 0% to 50% Al with the remainder Ga. The buffer layer 106 can have a thickness in a range of approximately 1 micron to 10 microns.

The lower and upper channel layers 122 and 142 can include a monocrystalline compound semiconductor material. The lower channel layer 122 may include a compound semiconductor material that is the same or different from the upper channel layer 142. In an embodiment, the upper channel layer 142 may allow for a higher Al content if needed or desired as compared to the lower channel layer 122. The lower channel layer 122 can include $Al_aGa_{(1-a)}N$, wherein $0 \leq a \leq 0.1$, and the upper channel layer 142 can include $Al_cGa_{(1-c)}N$, wherein $0 \leq c \leq 0.15$. In a particular embodiment, either or both of the lower and upper channel layers 122 and 142 include GaN (in the prior formulas, a=0 and c=0).

The lower channel layer 122 may have a sufficient thickness to reduce the likelihood that electrons from the 2DEG would become trapped in the buffer layer 106. The lower channel layer 122 can have a thickness in a range of 11 nm to 1000 nm, and in a particular embodiment, is in a range of 120 nm to 250 nm. A two dimensional hole gas (2DHG) can form along the interface between the upper channel layer 142 and the lower semiconductor layer 124. The upper channel layer 142 is further from the buffer layer 106, and therefore, the upper channel layer 142 can be thinner than the lower channel layer 122. The upper channel layer may have a thickness in a range of 10 nm to 200 nm, and in a particular embodiment, is in a range of 20 nm to 80 nm.

In an embodiment, current flowing along the upper channel layer 142 may be higher than current flowing along the lower channel layer 122. The current associated with each of the channel layers 122 and 142 can be affected by the Al content within the semiconductor layers 124 and 144. The lower semiconductor layer 124 may have a lower Al content as compared to the upper semiconductor layer 144, so that more current flows along the upper channel layer 142, as compared to the lower channel layer 122. In an embodiment, the lower semiconductor layer 124 may include at least 10% Al to allow for sufficient current. In an embodiment, the lower semiconductor layer 124 includes $Al_bGa_{(1-b)}N$, wherein $0.10 \leq b \leq 0.30$. More Al content in the upper semiconductor layer 144 allows for higher current; however, too much Al content may cause too much strain within the device. In an embodiment, the upper semiconductor 144 includes $Al_dGa_{(1-d)}N$, wherein $0.15 \leq d \leq 0.35$. The semiconductor layers 124 and 144 can have a thickness in a range of 10 nm to 40 nm. The semiconductor layers 124 and 144 can have the same or different thicknesses.

The layers 122, 124, 142, and 144 can be formed using an epitaxial growth technique, and thus the layers 122, 124, 142, and 144, and at least a portion of the buffer layer 106 can be monocrystalline. In a particular embodiment, the layers 122, 124, 142, and 144 can be formed using metalorganic chemical vapor deposition.

The passivation layer 160 allows for better surface passivation of the upper semiconductor layer 144 and limits the amount of charge trapped at the interface. In an embodiment, the passivation layer is formed before the upper semiconductor layer 144 is exposed to air, $O_2$, $H_2O$, or another reactive gas. The passivation layer can include a gate dielectric film 162, an intermediate film 164, and a capping film 166. In an embodiment, the gate dielectric film 162 can include a silicon nitride, an aluminum oxide, a zirconium oxide, a hafnium oxide, a niobium oxide, another suitable gate dielectric material, or any combination thereof and have a thickness in a range of 5 nm to 40 nm. The intermediate film 164 can act as an etch-stop layer when etching the capping film 166. In an embodiment, the intermediate film 164 can include AlN and have a thickness in a range of 2 nm to 20 nm. The capping film 166 can protect the gate dielectric film 162. In an embodiment, the capping film 166 can include silicon nitride and have a thickness in a range of 20 nm to 500 nm. In another embodiment, the passivation layer 160 can include fewer or more films that may have the same or different compositions as described. When the intermediate film 164 includes AlN, an optional $Al_2O_3$ film (not illustrated) can be formed by oxidizing a portion of the intermediate film 164 in an oxidizing ambient, such as $O_2$, $N_2O$, or the like. The passivation layer 160 or any films of the passivation layer 160 can be formed using a chemical or physical vapor technique.

Figure 2:
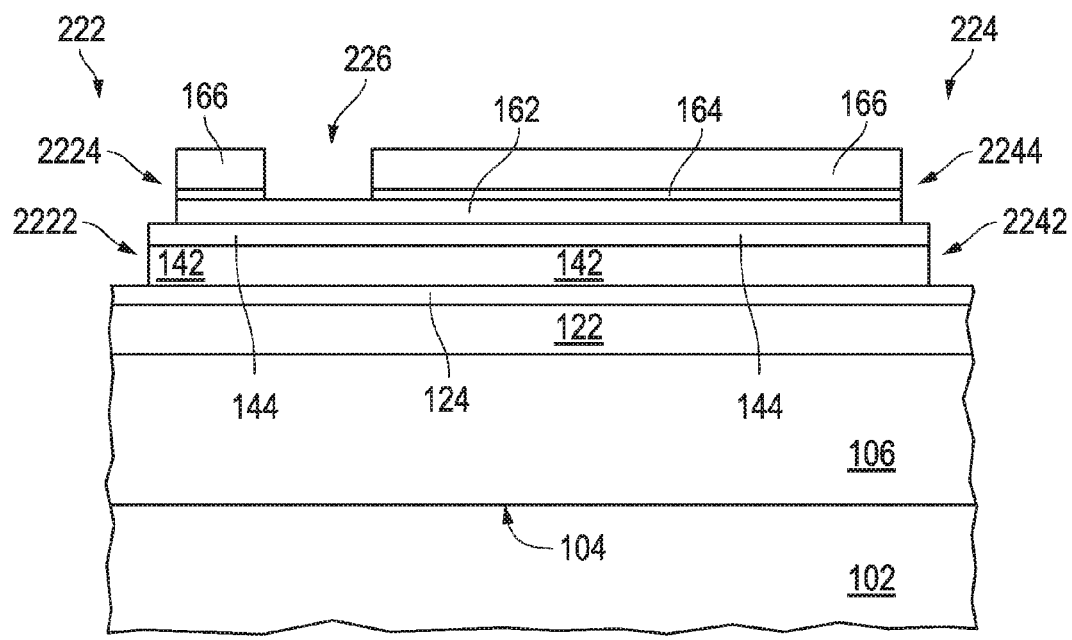
FIG. 2 includes an illustration of a cross-sectional view of the workpiece of FIG. 1 after forming contact and gate electrode openings.

FIG. 2 includes an illustration of a cross-sectional view of the workpiece of FIG. 1 after patterning the one or more layers to form a source contact opening 222, a drain contact opening 224, and a gate electrode opening 226. Each of the source and drain contact openings 222 and 224 have different portions corresponding to each of the channel layers 122 and 142. The source contact opening 222 includes a portion 2222 for the lower channel layer 122 and a portion 2224 for the upper channel layer 142, and the drain contact opening 224 includes a portion 2242 for the lower channel layer 122 and a portion 2244 for the upper channel layer 142. Different techniques can be used to form the portions.

In an embodiment, a first patterned resist layer can be used in patterning layers 162, 164, and 166 to form the portions 2224 and 2244 for the upper channel layer 142, and a second patterned resist layer can be used in patterning layers 142, 144, 162, 164, and 166 to form the portions 2222 and 2242 for the lower channel layer 122. In another embodiment, the sequence may be reversed. In a further embodiment, a patterned resist layer can be used in patterning layers 162, 164, and 166 to form the portions 2224 and 2244 for the upper channel layer 142. A sacrificial sidewall spacer (not illustrated) may be formed within the partially formed contact openings 222 and 224, and the layers 142 and 144 can be patterned within the opening as defined by the base of the sacrificial sidewall spacer.

The sacrificial sidewall spacers can then be removed. In the embodiment illustrated in FIG. 2, the portions 2222 and 2242 extend to the top surface of the lower semiconductor layer 124, and the portions 2224 and 2244 extend to the top surface of the upper semiconductor layer 144. In another embodiment, the portions 2222 and 2242 extend through the lower semiconductor layer 124 to the top surface or slightly below the top surface of the lower channel layer 122, and the portions 2224 and 2244 extend through the upper semiconductor layer 144 to the top surface or just slightly below the top surface of the upper channel layer 142. In a further embodiment, the portions 2222 and 2242 extend partly but not completely through the lower semiconductor layer 124, and the portions 2224 and 2244 extend partly but not completely through the upper semiconductor layer 144. In a non-limiting embodiment, the portions 2222 and 2242 may extend 20% to 80% of the thickness of the lower semiconductor layer 124, or the portions 2224 and 2244 may extend 20% to 80% of the thickness of the upper semiconductor layer 144. After reading the specification, skilled artisans will be able to determine the depths of the portions 2222, 2224, 2242, and 2244 for the contact openings 222 and 224 to meet needs or desires for a particular application. As used herein, the term "slightly below a top surface," with respect to a layer, is intended to mean that a portion of the contact openings extends through no more than 10% of the thickness of such layer.

Another patterned resist layer can be used to etch a portion of the passivation layer 160 to form the gate electrode opening 226. The gate electrode opening 226 can extend through the capping film 166 to the intermediate film 164. In another embodiment, the gate electrode opening 226 can extend through the capping film 166 and the intermediate film 164. In another embodiment, the passivation layer 160 can be a single layer, effectively corresponding to a combination of the gate dielectric film 162 and the capping film 166. The etch can be performed to extend the opening such that a portion of the single film remains below the gate electrode opening 226 and has a thickness as previously described with respect to the gate dielectric film 162.

The openings 222, 224, and 226 can be formed by etching. When etching a layer or film that includes Al, the etching can be performed using reactive ion etching with a chlorine-containing gas, such as $Cl_2$, $BCl_3$, HCl, or the like. When etching a layer of film that includes silicon nitride, the etching can be performed using reactive ion etching with a fluorine-containing gas, such as $SF_6$, $CHF_3$, $CF_4$, or the like. The etching can be performed as a timed etch, using endpoint detection, or a combination of endpoint detection along with a timed overetch.

Figure 3:
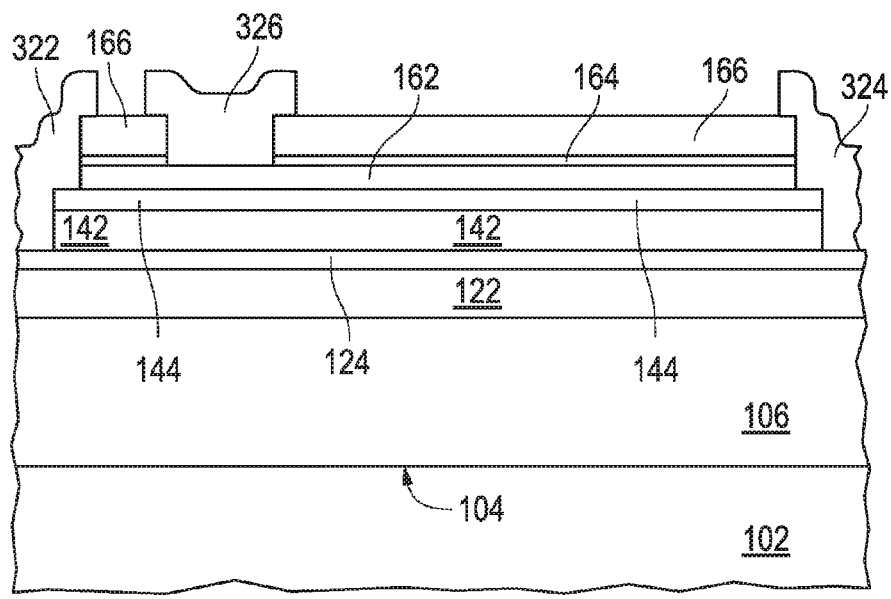
FIG. 3 includes an illustration of a cross-sectional view of the workpiece of FIG. 2 after forming source, drain, and gate electrodes.

In FIG. 3, the source and drain electrodes 322 and 324 and a gate electrode 326 are formed within the openings 222, 224, and 226. The different depths of the portions 2222, 2224, 2242, and 2244 of the source and drain contact openings 222 and 224 allow the source and drain electrodes to form stepped contacts. The stepped contacts allow lower contact resistance to each of the channel layers 122 and 142, as compared to source and drain electrodes formed to single depth.

The source and drain electrodes 322 and 324 and the gate electrode 326 can be formed by depositing conductive layer over the workpiece. The conductive layer can have a composition selected to provide a proper work function for the transistor being formed. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer has a thickness in a range of 50 nm to 500 nm. The conductive layer is patterned to form the source electrode 322, the drain electrode 324, and the gate electrode 326.

In an alternative embodiment, the source and drain contact openings 222 and 224 and source and drain electrodes 322 and 324 can be formed before forming the gate electrode opening 226 and gate electrode 326.

Figure 4:
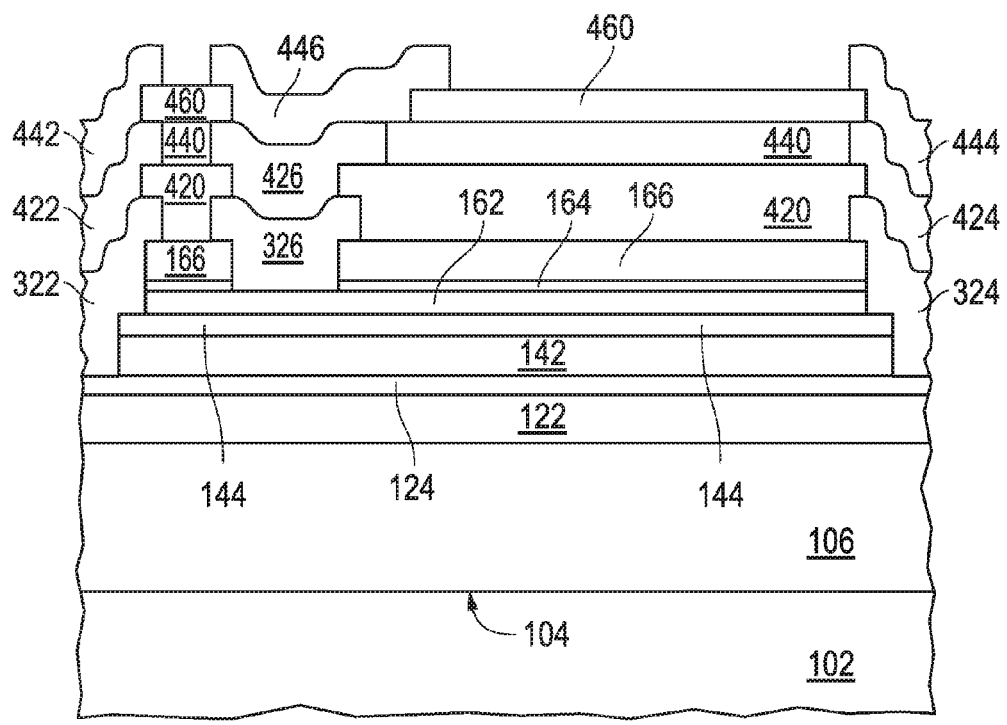
FIG. 4 includes an illustration of a cross-sectional view of the workpiece of FIG. 3 after forming interconnects and a gate shielding plate.

In FIG. 4, interlevel dielectric (ILD) layers 420, 440, and 460, interconnects 422, 424, 442, and 444, and gate shielding plates 426 and 446 are formed. The gate shielding plate 426 extends laterally further toward the drain as compared to the gate electrode 326, and the gate shielding plate 446 extends laterally further toward the drain as compared to each of the gate electrode 326 and the gate shielding plate 426. Each of the ILD layers 420, 440, and 460 can include one or more films of oxide, nitride, or oxynitride and have a thickness in a range of 0.1 microns to 4 microns. The ILD layers 420, 440, and 460 can have the same or different composition as compared to one another or may have the same or different thickness as compared to one another. Each of the interconnects 422, 424, 442, and 444 and the gate shielding plates 426 and 446 can include one or more films of conductive material. The interconnects are typically at least 50 wt % aluminum, copper, a noble metal, or an alloy of any of the foregoing.

Figure 5:
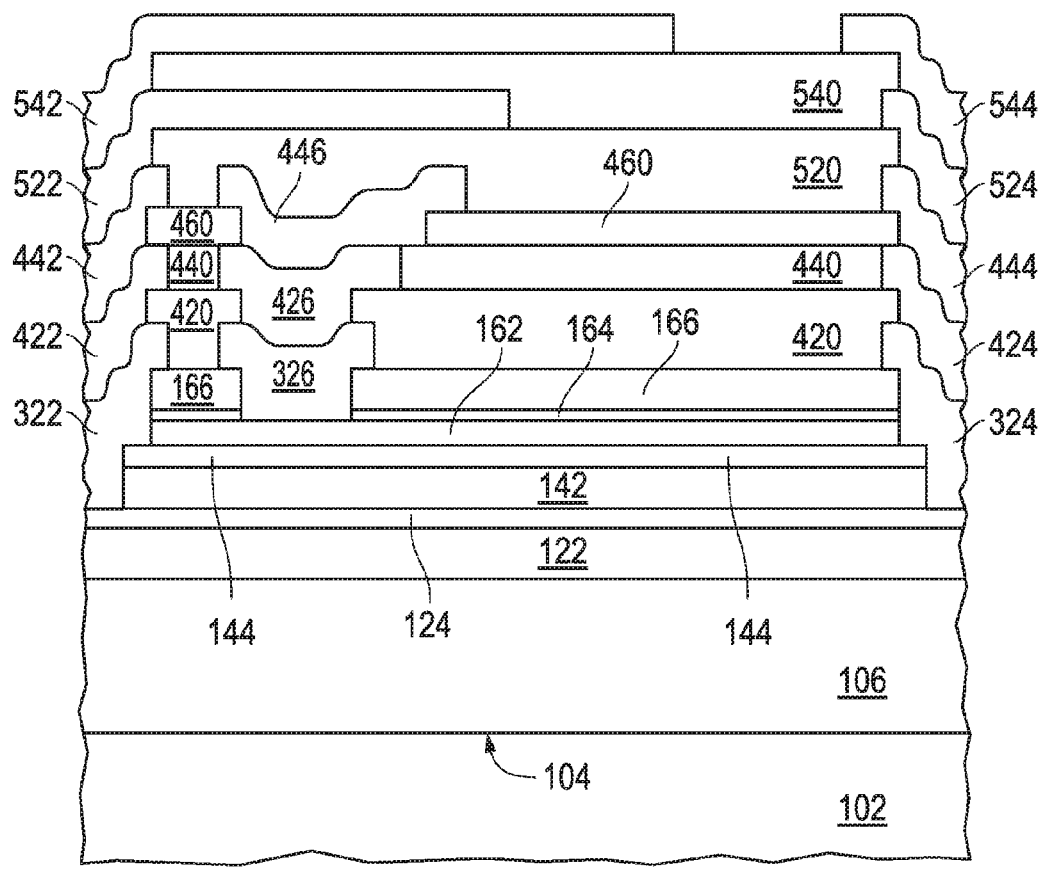
FIG. 5 includes an illustration of a cross-sectional view of the workpiece of FIG. 4 after forming a substantially completed electronic device.

In FIG. 5, ILD layers 520 and 540, interconnect 524, source shielding plates 522 and 542, and a drain shielding plate 544 are formed. The source shielding plate 522 extends laterally further toward the drain as compared to each of the gate electrode 326 and the gate shielding plate 426, and the source shielding plate 542 extends laterally further toward the drain as compared to each of the gate electrode 326, the gate shielding plate 426, and the source shielding plate 522. Each of the ILD layers 520 and 540 can include one or more films of oxide, nitride, or oxynitride and have a thickness in a range of 0.2 microns to 5 microns. The ILD layers 520 and 540 can have the same or different composition as compared to one another or may have the same or different thickness as compared to one another. Each of the interconnect 524 and the shielding plates 522, 542, and 544 can include one or more films of conductive material. The interconnects are typically at least 50 wt % aluminum, copper, a noble metal, or an alloy of any of the foregoing.

Processing is continued to form a substantially completed device. One or more insulating layers and levels of interconnects can be formed if needed or desired. The source, gate, and drain shielding plates control better electrical fields within the layers 122, 124, 142, and 144, provide a higher blocking voltage when the HEMT is off, reduce parasitic drain-to-gate capacitance, or other similar electronic properties. A passivation layer (not illustrated) may be formed over the uppermost level of interconnects.

Figure 6:
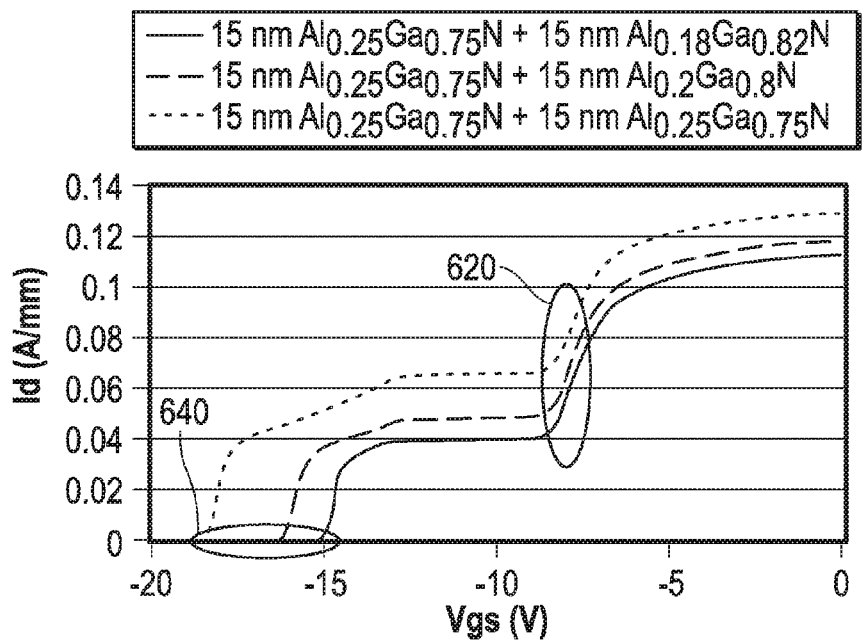
FIG. 6 includes a plot of drain current as a function of gate voltage for different Al contact in a lower semiconductor layer to demonstrate differences in pinch-off voltages for different channel layers.

The HEMT as illustrated in FIG. 5 is a depletion-mode transistor. FIG. 6 includes a plot of drain current (Id) as a function of voltage on the gate electrode opening 226 (Vgs). Three different device configurations were simulated. The composition of the lower semiconductor layer 124 is varied for the different configurations. One of the device configurations has a lower semiconductor layer 124 that includes $Al_{0.18}Ga_{0.82}N$, another device configuration included $Al_{0.2}Ga_{0.8}N$, and still another configuration includes $Al_{0.25}Ga_{0.75}N$. All of the device configurations have lower and upper semiconductor layers with a thickness of 15 nm, and the upper semiconductor layer 144 included $Al_{0.25}Ga_{0.75}N$.

At Vgs of 0 V, Id is approximately 0.11 A/mm to approximately 0.13 A/mm. The pinch-off of 2DEG for the upper channel layer 142 occurs at approximately −7 V to approximately −8V, as noted by oval 620 in FIG. 6. The pinch-off of 2DEG for the lower channel layer 122 occurs at approximately −14 V to approximately −18 V, as noted by oval 640 in FIG. 6. The absolute value of the difference in the pinch-off voltages can be determined by Equation 1 below.

$$\Delta V_{PO} = |V_{POUC} - V_{POLC}| \qquad \text{Equation 1}$$

where, $\Delta V_{PO}$ is the absolute value of difference in pinch-off voltages;

$\Delta V_{POUC}$ is the pinch-off voltage of 2DEG for the upper channel layer 142; and $\Delta V_{POLC}$ is the pinch-off voltage of 2DEG for the lower channel layer 122.

Such a difference in pinch-off voltages between the 2DEGs for the channel layers 122 and 142 allow current flow along the upper channel layer 142 to be pinched off and still allow current flow along the lower channel layer 122 with reasonable control. The $\Delta V_{PO}$ can be greater than 1 V. In an embodiment, $\Delta V_{PO}$ is at least 2 V, 3 V, 4 V, or even higher. Conventional double channel HEMTs have $\Delta V_{PO}$ not greater than 1 V, and typically is significantly lower. Accordingly, conventional double channel HEMTs do not allow for the ability to control the device, such that current for the upper channel layer can be turned off separate from the lower channel layer.

An electronic device can include a HEMT having more than two channel layers. The amount of current that can flow through the HEMT can increase as the number of channel layers increases. The semiconductor layers between the channel layers of the HEMT can have an Al content that increases with the distance from the substrate. Vgs will have a magnitude further from 0 V as the number of channels increase. For a depletion-mode transistor, a more negative Vgs is needed to turn off all channel layers within the HEMT. The ability to turn off current to individual channel layers may become more difficult as $\Delta V_{PO}$ between two adjacent channel layers may be less than 1 V.

In another embodiment, a HEMT can be an enhancement-mode transistor with at least two channel layers. The previous description of pinch-off voltages with respect to a depletion-mode transistor can apply to threshold voltages for the enhancement-mode transistor. When the HEMT is an enhancement-mode transistor, when Vgs is between the threshold voltage of an upper channel layer and the threshold voltage for a lower channel layer, current can flow along the upper channel layer without significant current flowing along the lower channel layer.

Embodiments as described herein can help to form a HEMT with at least two channel layers wherein current for at least one channel layer can be turned off or turned on without significantly affecting current flow for an adjacent channel layer. In an embodiment, the proper selection of Al content of semiconductor layers adjacent to channel layers can allow $\Delta V_{PO}$ of greater than 1 V, and in many embodiments, higher can allow for the ability to selectively pinch-off 2DEG for different channel layers.

The stepped source and drain electrodes allow the contact resistance for each of the channel layers to be relatively low, as compared to source and drain electrodes that contact only a side of a particular channel layer. For example, if the source and drain electrodes only included the deeper portions, contact to the upper channel layer would be only along a side of the upper channel layer, and the contact resistance may be too high and adversely affect on-state resistance $R_{DSON}$. The stepped source and drain electrodes help to reduce $R_{DSON}$.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising:
a first channel layer;
a first semiconductor layer overlying the first channel layer, wherein the first semiconductor layer has a first aluminum content that is at least 10% of a total metal content of the first semiconductor layer;
a second channel layer overlying the first semiconductor layer; and
a second semiconductor layer overlying the second channel layer, wherein the second semiconductor layer has a second aluminum content that is greater than the first aluminum content.

Embodiment 2

The electronic device of Embodiment 1, wherein the first channel layer has a first pinch-off voltage; the second channel layer has a second pinch-off voltage; and an absolute value of a difference between the first and second pinch-off voltages is greater than 1 V.

Embodiment 3

The electronic device of Embodiment 1, wherein the first channel layer includes $Al_aGa_{(1-a)}N$, wherein $0 \le a \le 0.1$; the first semiconductor layer includes $Al_bGa_{(1-b)}N$, wherein $0.10 \le b \le 0.30$; the second channel layer includes $Al_cGa_{(1-c)}N$, wherein $0 \le c \le 0.15$; and the second semiconductor layer includes $Al_dGa_{(1-d)}N$, wherein $0.15 \le d \le 0.35$;

Embodiment 4

The electronic device of Embodiment 3, wherein a=0, and c=0.

Embodiment 5

The electronic device of Embodiment 1, further comprising a substrate and a buffer layer overlying the substrate, wherein the buffer layer is disposed between the substrate and the first channel layer.

Embodiment 6

The electronic device of Embodiment 5, wherein the first channel layer is thicker than the second channel layer and has a thickness of at most 1000 nm.

Embodiment 7

The electronic device of Embodiment 1, wherein the electronic device comprises a high voltage transistor that includes the first and second channel layers.

Embodiment 8

The electronic device of Embodiment 7, further comprising:
a passivation layer overlying the second semiconductor layer; and
a gate electrode, wherein at least a portion of the passivation layer is disposed between the gate electrode and the second channel layer.

Embodiment 9

The electronic device of Embodiment 8, wherein the passivation layer comprises a first insulating nitride layer overlying the second semiconductor layer; a III-N layer overlying the first insulating nitride layer; and a second insulating nitride layer overlying the III-N layer.

Embodiment 10

The electronic device of Embodiment 1, wherein each of the first and second channel layers and the first and second semiconductor layers has a dopant concentration of at most $1 \times 10^{15}$ atoms/cm$^3$.

Embodiment 11

The electronic device of Embodiment 1, further comprising:
a substrate;
a buffer layer overlying the substrate;
a passivation layer overlying the second semiconductor layer; and
a gate electrode configured to control the first and second channel layers,
wherein:
the electronic device comprises a double channel power HEMT;
the first channel layer is a first GaN channel layer overlying the buffer layer, wherein the first GaN channel layer has a thickness in a range of 11 nm to 1000 nm;
the first semiconductor layer includes $Al_bGa_{(1-b)}N$, wherein $0.10 \le b \le 0.30$ and has a thickness in a range of 10 nm to 40 nm;
the second channel layer is a second GaN channel layer overlying the first semiconductor layer is thinner than the first channel layer, and has a thickness in a range of 10 nm to 200 nm;
the second semiconductor layer has a greater aluminum content as compared to the first semiconductor layer, includes $Al_dGa_{(1-d)}N$, wherein $0.15 \leq d \leq 0.35$ and has a thickness in a range of 10 nm to 40 nm;
the first channel layer has a first pinch-off voltage;
the second channel layer has a second pinch-off voltage; and
an absolute value of a difference between the pinch-off voltages of the first and second channel layers is greater than 2 V.

Embodiment 12

An electronic device comprising:
a substrate;
a first channel layer overlying the substrate;
a second channel layer overlying the first channel layer;
a source electrode overlying the substrate; and
a drain electrode overlying the substrate,
wherein:
the source electrode, the drain electrode or each of the source and drain electrodes includes a first portion and a second portion;
the substrate is closer to the first portion as compared to the second portion;
for current flowing through the first channel layer, more current flows through the first portion than through the second portion; and
for current flowing through the second channel layer, more current flows through the second portion than through the first portion.

Embodiment 13

The electronic device of Embodiment 12, further comprising a first semiconductor layer disposed between the first and second channel layers; and a second semiconductor layer overlying the second channel, wherein the first portion extends through the second channel layer and the second semiconductor layer, and the second portion does not extend through the second channel layer or to the first channel and first semiconductor layers.

Embodiment 14

A process of forming an electronic device comprising a HEMT, comprising:
forming a first channel layer over a substrate and having a first pinch-off voltage or a first threshold voltage;
forming a second channel layer overlying the first channel layer and having a second pinch-off voltage or a second threshold voltage,
wherein:
when the HEMT is a depletion-mode transistor, an absolute value of a difference between the first and second pinch-off voltages is greater than 1 V, or
when the HEMT is an enhancement-mode HEMT, an absolute value of a difference between the first and second threshold voltages is greater than 1 V.

Embodiment 15

The process of Embodiment 14, further comprising forming a first semiconductor layer overlying the first channel layer, wherein the first semiconductor layer has a first aluminum content that is at least 10% of a total metal content of the first semiconductor layer; and forming a second semiconductor layer overlying the second channel layer, wherein the second semiconductor layer has a second aluminum content that is greater than the first aluminum content.

Embodiment 16

The process of Embodiment 14, wherein each of the first and second channel layers has a dopant concentration of at most $1 \times 10^{15}$ atoms/cm$^3$.

Embodiment 17

The process of Embodiment 14, further comprising:
forming an insulating layer over the second semiconductor layer;
patterning the insulating layer to define a first source contact opening and a first drain contact opening;
patterning the insulating layer to define a second source contact opening and a second drain contact opening,
wherein the first source contact opening has a different depth as compared to the second source contact opening, and the first drain contact opening has a different depth as compared to the second drain contact opening.

Embodiment 18

The process of Embodiment 17, further comprising forming a source electrode and a drain electrode, wherein:
a first portion of the source electrode is within the first source contact opening and is along a current path for the first channel layer;
a first portion of the drain electrode is within the first drain contact opening and is along the current path for the first channel layer;
a second portion of the source electrode is within the second source contact opening and is along a current path for the second channel layer; and
a second portion of the drain electrode is within the second drain contact opening and is along the current path for the second channel layer.

Embodiment 19

The process of Embodiment 14, further comprising forming a passivation layer overlying the second semiconductor layer; and forming a gate electrode over at least a portion of the passivation layer, wherein the gate electrode that is configured to control current flow within the first and second channel layers.

Embodiment 20

The process of Embodiment 14, further comprising:
forming a buffer layer of the substrate before forming the first channel layer;
forming a first semiconductor layer over the first channel layer, wherein the first semiconductor includes $Al_bGa_{(1-b)}N$, wherein $0.10 \leq b \leq 0.30$ and has a thickness in a range of 10 nm to 40 nm;
forming a second semiconductor layer over the second channel, wherein the second semiconductor layer has a greater aluminum content as compared to the first semiconductor layer, includes $Al_dGa_{(1-d)}N$, wherein $0.15 \le d \le 0.35$ and has a thickness in a range of 10 nm to 40 nm; and forming a passivation layer over the second semiconductor layer;

forming a source electrode to the first and second channel layers;

forming a drain electrode to the first and second channel layers; and forming a gate electrode over at least a part of the passivation layer, wherein from a top view, the gate electrode is disposed between the source and drain electrodes, wherein:

forming the first channel layer includes forming a first GaN channel layer over the buffer layer, wherein the first GaN channel layer has a thickness in a range of 11 nm to 1000 nm; and forming the second channel layer comprises forming a second GaN channel layer over the first semiconductor layer, is thinner than the first channel layer, and has a thickness in a range of 10 nm to 200 nm.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a first channel layer;
   a first semiconductor layer overlying the first channel layer, wherein the first semiconductor layer has a first aluminum content that is at least 10% of a total metal content of the first semiconductor layer;
   a second channel layer overlying the first semiconductor layer; and
   a second semiconductor layer overlying the second channel layer, wherein the second semiconductor layer has a second aluminum content that is greater than the first aluminum content.

2. The electronic device of claim 1, wherein:
   the first channel layer has a first pinch-off voltage;
   the second channel layer has a second pinch-off voltage; and
   an absolute value of a difference between the first and second pinch-off voltages is greater than 1 V.

3. The electronic device of claim 1, wherein:
   the first channel layer includes $Al_aGa_{(1-a)}N$, wherein $0 \le a \le 0.1$;
   the first semiconductor layer includes $Al_bGa_{(1-b)}N$, wherein $0.10 \le b \le 0.30$;
   the second channel layer includes $Al_cGa_{(1-c)}N$, wherein $0 \le c \le 0.15$; and
   the second semiconductor layer includes $Al_dGa_{(1-d)}N$, wherein $0.15 \le d \le 0.35$.

4. The electronic device of claim 3, wherein a=0, and c=0.

5. The electronic device of claim 1, further comprising a substrate and a buffer layer overlying the substrate, wherein the buffer layer is disposed between the substrate and the first channel layer.

6. The electronic device of claim 5, wherein the first channel layer is thicker than the second channel layer and has a thickness of at most 1000 nm.

7. The electronic device of claim 1, wherein the electronic device comprises a high voltage transistor that includes the first and second channel layers.

8. The electronic device of claim 7, further comprising:
   a passivation layer overlying the second semiconductor layer; and
   a gate electrode, wherein at least a portion of the passivation layer is disposed between the gate electrode and the second channel layer.

9. The electronic device of claim 8, wherein the passivation layer comprises:
   a first insulating nitride layer overlying the second semiconductor layer;
   a III-N layer overlying the first insulating nitride layer; and
   a second insulating nitride layer overlying the III-N layer.

10. The electronic device of claim 1, wherein each of the first and second channel layers and the first and second semiconductor layers has a dopant concentration of at most $1 \times 10^{15}$ atoms/cm$^3$.

11. The electronic device of claim 1, further comprising:
    a substrate;
    a buffer layer overlying the substrate;
    a passivation layer overlying the second semiconductor layer; and
    a gate electrode configured to control the first and second channel layers,
    wherein:
    the electronic device comprises a double channel power HEMT;
    the first channel layer is a first GaN channel layer overlying the buffer layer, wherein the first GaN channel layer has a thickness in a range of 11 nm to 1000 nm;
    the first semiconductor layer includes $Al_bGa_{(1-b)}N$, wherein $0.10 \le b \le 0.30$ and has a thickness in a range of 10 nm to 40 nm;
    the second channel layer is a second GaN channel layer overlying the first semiconductor layer is thinner than the first channel layer, and has a thickness in a range of 10 nm to 200 nm;

the second semiconductor layer has a greater aluminum content as compared to the first semiconductor layer, includes $Al_dGa_{(1-d)}N$, wherein $0.15 \le d \le 0.35$ and has a thickness in a range of 10 nm to 40 nm;

the first channel layer has a first pinch-off voltage;

the second channel layer has a second pinch-off voltage; and an absolute value of a difference between the pinch-off voltages of the first and second channel layers is greater than 2 V.

12. An electronic device comprising:

a substrate;

a first channel layer overlying the substrate;

a second channel layer overlying the first channel layer;

a source electrode overlying the substrate; and a drain electrode overlying the substrate, wherein:

the source electrode, the drain electrode or each of the source and drain electrodes includes a first portion and a second portion;

the substrate is closer to the first portion as compared to the second portion;

for current flowing through the first channel layer, more current flows through the first portion than through the second portion; and for current flowing through the second channel layer, more current flows through the second portion than through the first portion.

13. The electronic device of claim 12, further comprising:

a first semiconductor layer disposed between the first and second channel layers; and a second semiconductor layer overlying the second channel, wherein the first portion extends through the second channel layer and the second semiconductor layer, and the second portion does not extend through the second channel layer or to the first channel and first semiconductor layers.

* * * * *